United States Patent [19]
Beck et al.

[11] Patent Number: 6,147,508
[45] Date of Patent: Nov. 14, 2000

[54] POWER CONSUMPTION CONTROL MECHANISM AND METHOD THEREFOR

[75] Inventors: John Andrew Beck, Austin; David William Boerstler, Round Rock; Christopher McCall Durham; Peter Juergen Klim, both of Austin, all of Tex.

[73] Assignee: International Business Machines Corp., Armonk, N.Y.

[21] Appl. No.: 09/137,776

[22] Filed: Aug. 20, 1998

[51] Int. Cl.[7] .................... H03K 17/16; H03K 19/0948; H03K 3/011

[52] U.S. Cl. .............................. 326/32; 326/34; 326/121; 327/534

[58] Field of Search .................................. 326/31–34, 83, 326/86, 121; 327/534–535

[56] References Cited

U.S. PATENT DOCUMENTS

| | | | |
|---|---|---|---|
| 4,791,318 | 12/1988 | Lewis et al. | 327/537 |
| 5,099,146 | 3/1992 | Miki et al. | 327/534 |
| 5,103,277 | 4/1992 | Caviglia et al. | 257/348 |
| 5,557,231 | 9/1996 | Yamaguchi et al. | 327/534 |
| 5,565,798 | 10/1996 | Durham et al. | 326/93 |
| 5,612,643 | 3/1997 | Hirayama | 327/534 |
| 5,612,645 | 3/1997 | Halepete | 327/537 |
| 5,740,094 | 4/1998 | Klim | 364/754 |

*Primary Examiner*—Jon Santamauro
*Attorney, Agent, or Firm*—Barry S. Newberger; Winstead Sechrest & Minick P.C.; Anthony V. S. England

[57] ABSTRACT

An apparatus and method for controlling the power consumption of a logic device are implemented. The power dissipation, and consequently, the speed of a complementary metal oxide semiconductor (CMOS) logic device is substantially proportional to the speed of the device. The temperature of the logic device is controlled by controlling the device speed by adjusting the threshold voltage of the metal oxide semiconductor (MOS) devices forming the logic device under control. The threshold voltage of the devices is controlled by applying a back bias voltage between the bulk material in which each device under control is fabricated, and the most positive electrode of the device. The back bias voltage value is regulated in response to the logic device temperature, thereby closing a feedback loop.

38 Claims, 5 Drawing Sheets

POWER CONSUMPTION CONTROL MECHANISM AND METHOD THEREFOR

TECHNICAL FIELD

The present invention relates in general to data processors, and in particular, to power consumption control in self-timed processors.

BACKGROUND INFORMATION

In self-timed processors, data is staged through the logical elements constituting the processor under the control of the logical elements themselves. When a logical element evaluates, it informs the preceding stages from which it receives data, which may then reset. When all of the logic blocks inputting signals to a particular logic block have reset, then that block resets. Thus, the speed at which data is transmitted through a self-timed processor depends on the evaluation speed of the underlying logic blocks.

The power consumption of a self-timed processor is substantially directly proportional to the processor's speed. Concomitantly, the processor's temperature is substantially proportional to the power consumed. As a consequence, the performance of self-timed processors may be limited by the processor's thermal capabilities, including the ability of its packaging to dissipate heat. Circuits in self-timed processing systems may be designed with aggressive speed targets if a method may be had that continuously controls the speed of the circuits as a function of temperature.

Thus, there is a need in the art for an apparatus and method that continuously monitors the temperature of the logic circuitry in self-timed processors, and which adjusts the speed of the circuits in accordance with a temperature specification. The apparatus and method speed up the circuitry if the processor is running cool, or slow the circuitry down if the processor temperature exceeds a predetermined value.

SUMMARY OF THE INVENTION

The previously mentioned needs are addressed by the present invention. Accordingly, there is provided in a first form an apparatus for controlling power consumption of a logic device including a metal oxide semiconductor (MOS) device having a well including a first dopant region in a substrate and two second dopant regions in the well, wherein a portion of the well is operable for forming a conducting channel therebetween. The well fiber includes a third region having a predetermined first dopant concentration greater than a first dopant concentration in the well, wherein the third region is operable for receiving a back bias signal, and wherein the conducting channel forms in response to a threshold voltage controlled by the back bias signal. The apparatus also includes a voltage supply coupled to the third region, wherein the voltage supply is operable for outputting a voltage in response to the temperature of the logic device.

There is also provided, in an alternative embodiment, an apparatus for controlling power consumption of a logic device constituting a MOS device having a back gate electrode, the back gate electrode being operable for modifying a threshold voltage of the MOS device in response to a voltage signal supplied thereto. The apparatus further includes a voltage supply coupled to the back gate electrode, wherein the voltage supply is operable for outputting a voltage in response to the temperature of the logic device.

There is also provided in another alternative embodiment an apparatus to control power consumption of a logic device comprising including a plurality of logic units. Each logic unit performs a Boolean evaluation of a signal on at least one logic input. Each logic unit has a logic output for outputting an output logic signal, at least one completion output for signaling to a logic unit having the output coupled to the at least one logic input, and at least one completion input for receiving a completion signal from a logic unit having at least one input coupled to coupled to the output, at least one p-type semiconductor (PMOS) device and at least one R-type metal oxide semiconductor (NMOS) device. Each logic unit also includes an input for receiving a PMOS back bias signal, and an input for receiving an NMOS back bias signal. The apparatus further constitutes a plurality of voltage generator circuits, wherein a first one of the plurality of voltage generator circuits outputs a temperature-controlled PMOS back bias signal coupled to a first one of the inputs for receiving the PMOS back bias signal, and a second one of the plurality of voltage generator circuits outputs a temperature-controlled NMOS back bias signal to a first one of the inputs for receiving the NMOS back bias signal.

Additionally there is provided, in a second form, a method of controlling a temperature of a logic device. The method includes the steps of providing a back gate electrode in a metal oxide semiconductor device, wherein the back gate electrode is operable for modifying a threshold voltage of the MOS device in response to a voltage signal supplied thereto, and applying a voltage supply to the back gate electrode, wherein the voltage supply is operable for outputting a voltage in response to the temperature of the logic device.

Additionally there is provided, in an alternative embodiment, a method of controlling power consumption of a logic device including the step sending a completion signal from a first logic unit in the logic device to a second logic unit in the logic device in response to the first logic unit evaluating a logic signal output from the second logic unit to a logic input of the first logic unit. The method further includes the steps of generating first and second temperature-controlled p-type metal oxide semiconductor (PMOS) back bias signals, wherein the first and second PMOS back bias signals are controlled in response to a temperature of the first and second logic units, respectively, and wherein the first PMOS back bias signal is applied to a PMOS back bias input of the first logic unit and the second PMOS back bias signals is supplied to a PMOS back bias input of the second logic unit, and generating first and second temperature-controlled n-type metal oxide semiconductor (NMOS) back bias signals, wherein the first and second PMOS back bias signals are controlled in response to a temperature of the first and second logic units, respectively, and wherein the first NMOS back bias signal is applied to a NMOS back bias input of the first logic unit and the second NMOS back bias signal is supplied to a NMOS back bias input of the second logic unit.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION

The present invention provides a power consumption control mechanism in self-timed processor systems. Power consumption is controlled, in accordance with the principles of the present invention, by supplying a variable back bias to the active elements in the logic circuitry constituting the processor. The back bias is controlled in response to the processor temperature. The evaluation speed of the logic circuits is thereby adjusted in response to the temperature of the processor.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 1:
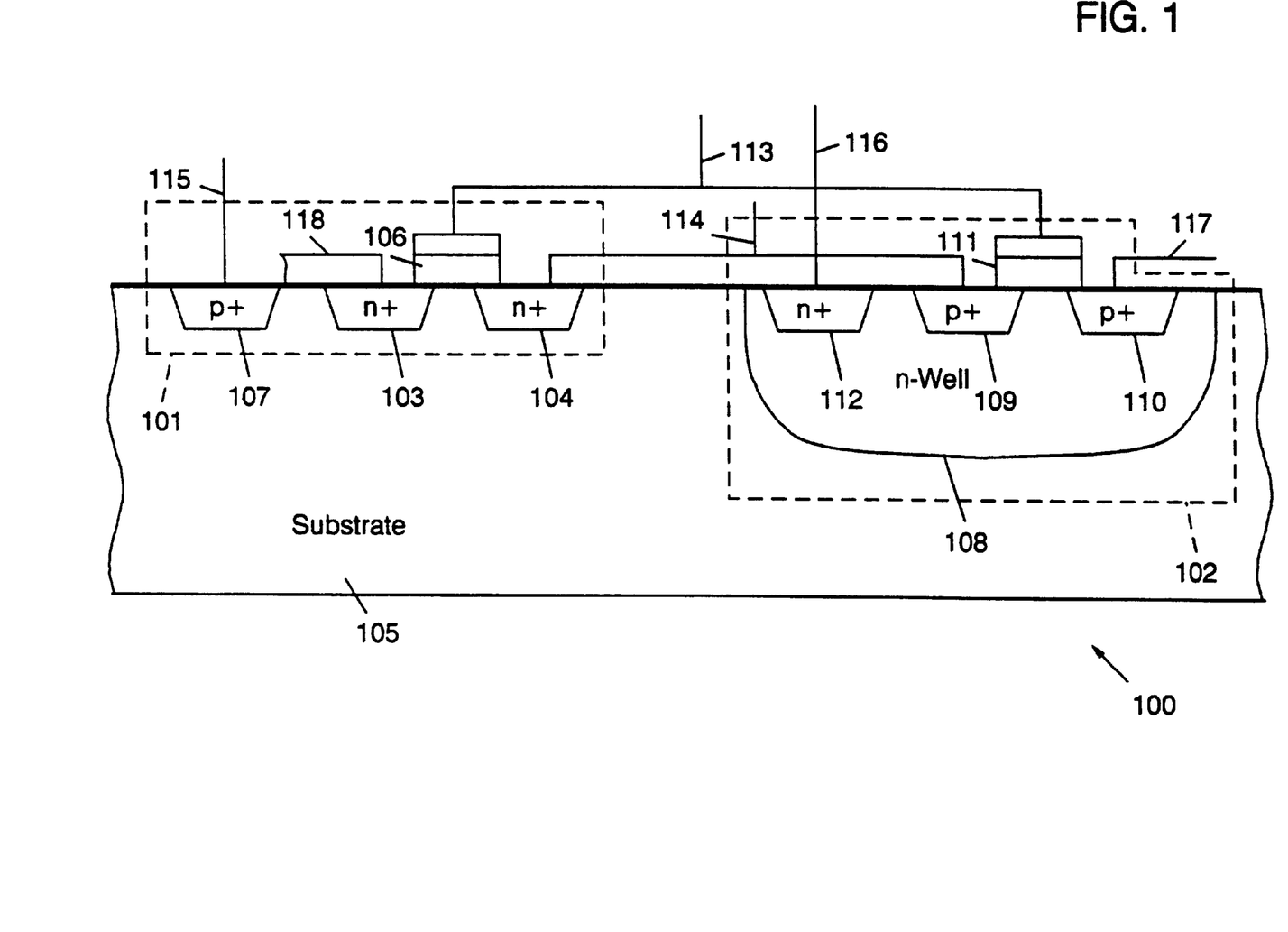
FIG. 1 illustrates, in simplified cross-section form, an embodiment of a CMOS n-well inverter in accordance with the principles of the present invention.

Refer now to FIG. 1 in which is illustrated a simplified cross-section of a complementary metal oxide semiconductor (CMOS) inverter 100 incorporating the principles of the present invention. Inverter 100 includes two metal oxide semiconductor (MOS) devices, n-type metal-oxide semiconductor (NMOS) device 101, and p-type metal-oxide semiconductor (PMOS) device 102. NMOS device 101 includes two n-type doping regions 103 and 104 in p-type substrate 105. Gate electrode 106 in NMOS device 101 controls channel formation between the two n-type doping regions 103 and 104. NMOS device 101 also includes a p-type doping region 107 in p-type substrate 105. A concentration of acceptor dopant in region 107 is greater than that in substrate 105.

PMOS device 102 includes n-type well 108, an n-type doping region, in p-type substrate 105. Two p-type doping regions 109 and 110 are formed in n-well 108, with gate electrode 111 controlling channel formation between p-type doping regions 109 and 110. PMOS device 102 also includes an n-type doping region 112 in n-well 108. A donor dopant concentration in region 112 may be greater than the dopant concentration in n-well 108.

Gate electrodes 106 and 111 form the input 113 of inverter 100. Output 114 of inverter 100 is formed from n-type doping region 104 and p-type doping region 109. A first supply voltage 117 is provided to p-type doping region 110 and a second supply voltage 118 is provided to n-type doping region 103. First supply voltage 117 may be $V_{dd}$, and second supply voltage 118 may be ground.

The respective threshold voltage, $V_{th}$, of NMOS device 101 and PMOS device 102 may be controlled by supplying a corresponding bias voltage to p-type region 107 and n-type region 112. The threshold voltage of a MOS device is substantially the gate voltage necessary to initiate conduction for the device. By applying NMOS back bias voltage 115 to region 107 in NMOS 101, the threshold voltage of NMOS 101 may be raised or lowered according to the value of back bias voltage 115. Similarly, PMOS back bias voltage 116 applied to region 112 in PMOS 102 can modify the threshold voltage of that device.

The evaluation speed of an MOS device depends on its threshold voltage. Thus, the evaluation speed of an MOS device may be controlled by controlling its threshold voltage which, in turn, may be controlled in NMOS device 101 and PMOS device 102 by applying NMOS back bias 115 and PMOS back bias 116, respectively.

In accordance with the principles of the present invention NMOS back bias 115 and PMOS back bias 116 are continuously controlled in response to the temperature of the logic device including inverter 100. In CMOS inverter 100, in which PMOS device 102 includes n-well 108, the control of the threshold voltage of PMOS device 102 is controlled within n-well 108. However, the control of the threshold voltage of NMOS device 101 via NMOS back bias 115 applied to region 107 changes the bias in p-type substrate 105. Therefore, in a CMOS device having a plurality of NMOS devices 101, the threshold voltage of all of the NMOS devices 101 would be effected by NMOS back bias 115. Therefore, it may be advantageous to apply the principles of the present invention in CMOS structures having a twin well structure.

Figure 2:
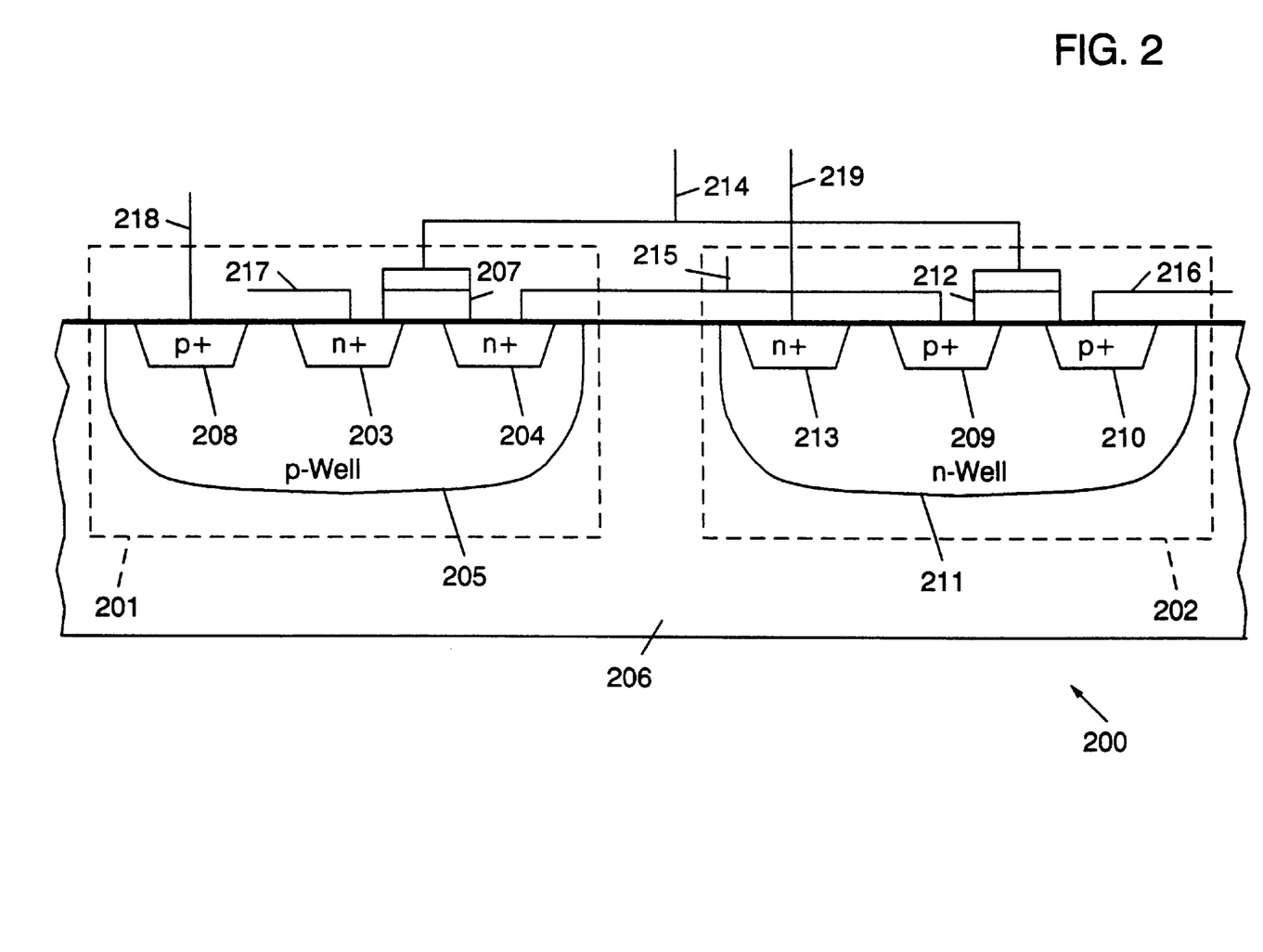
FIG. 2 illustrates, in simplified cross-section form, an embodiment of a CMOS twin-well inverter in accordance with the principles of the present invention.

Refer now to FIG. 2 in which is illustrated a CMOS inverter 200 in accordance with the principles of the present invention having a twin well structure. Inverter 200 includes NMOS device 201 and PMOS device 202. NMOS device 201 includes n-type regions 203 and 204 formed in p-type well 205. P-type well 205 is formed from a positively doped region in substrate 206, which may be an intrinsic semiconductor. Gate electrode 207 controls channel formation between n-type regions 203 and 204. NMOS device 201 also includes p-type region 208 having a donor concentration that may exceed the acceptor concentration of p-well 205.

Similarly, PMOS device 202 includes p-type regions 209 and 210 formed in n-well 211. N-well 211 constitutes a donor doped region in substrate 206. Gate electrode 212 controls the formation of channel between p-type regions 209 and 210. N-type region 213 is also formed in n-well 211 of NMOS device 202. A donor concentration of n-type region 213 may be greater than that in n-type well 211.

Gates 207 and 212 are coupled together to form input 214 of inverter 200. Output 215 of inverter 200 is formed by coupling n-type region 204 in NMOS 201 and p-type region 209 in PMOS 202. A first supply voltage 216, $V_{dd}$, is provided to region 210. A second supply voltage 217, $V_{ss}$, which may be ground, is supplied to region 203.

Threshold voltages of NMOS device 201 and PMOS device 202 are controlled by applying corresponding back biases to p-type region 208 and n-type region 213. As previously discussed, the evaluation speed of these devices may be controlled by the application of the back bias through its effect on the threshold voltage of the devices. NMOS back bias voltage 218 is applied to p-type region 208 in NMOS device 201. NMOS back bias 218 biases p-type well 205, in contrast to inverter 100 in FIG. 1 wherein the NMOS back bias 115 biases substrate 105. Thus, in an embodiment of a logic device including a plurality of inverters 200 in accordance with the principles of the present invention, the threshold voltage of each NMOS device 201 so formed may be individually controlled. In this way, the speed of individual circuits, or alternatively, groups of circuits, may be controlled by forming them in individual wells 205. In this way, the structure of NMOS device 201 is similar to PMOS device 202 wherein PMOS back bias 219 biases n-type well 211.

Figure 3:
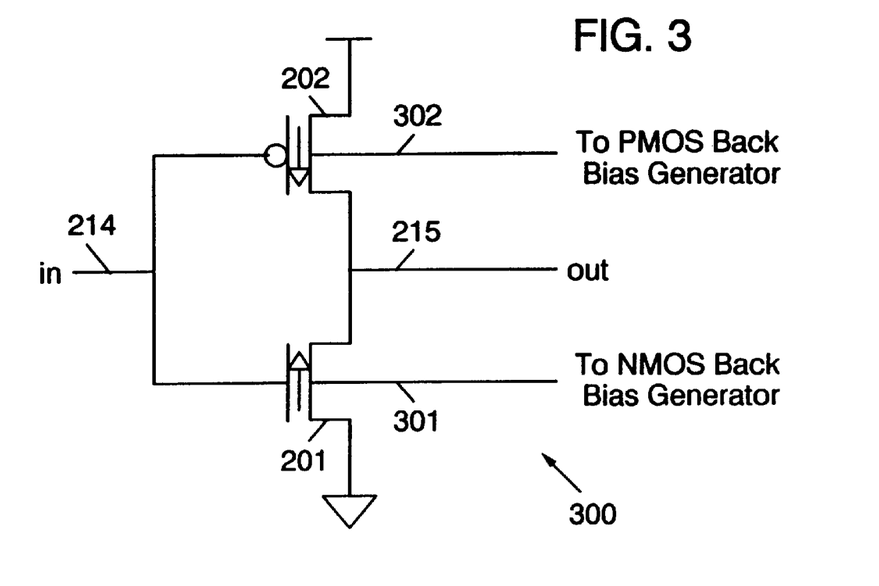
FIG. 3 illustrates, in schematic form, an embodiment of a CMOS inverter circuit in accordance with the principles of the present invention.

An inverter, such as inverter 200 of FIG. 2, is illustrated schematically in FIG. 3. Inverter 200 includes NMOS device 201 and PMOS device 202. A source of NMOS device 201 is coupled to ground, and a source of PMOS device 202 is coupled to a voltage supply, which may be $V_{dd}$. The gates of NMOS device 201 and PMOS device 202 are coupled together to form input 214, and drains of these devices are coupled together to form output 215.

NMOS 201 and PMOS 202 are schematically illustrated as having back gate electrodes 301 and 302, respectively. Speed control of devices 201 and 202 is provided by coupling temperature dependent voltage sources to back gate 301 and to back gate 302. Such voltage sources will be discussed in conjunction with FIGS. 5 and 6.

Figure 4A:
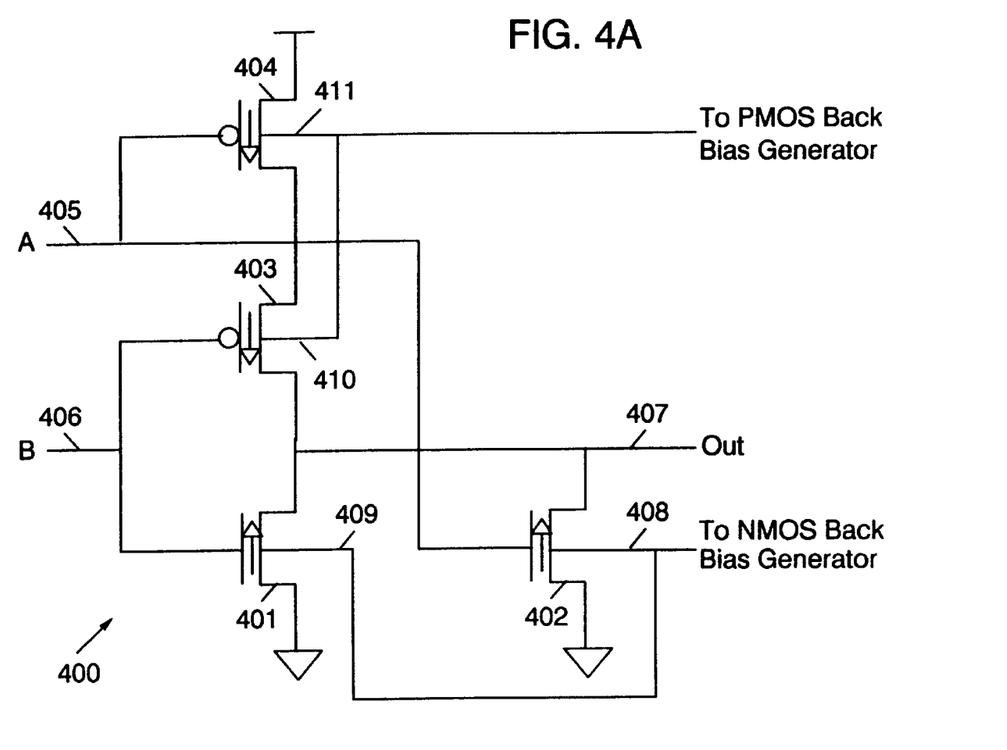
FIG. 4A illustrates, in schematic form, an embodiment of a CMOS NOR gate in accordance with the principles of the present invention.

Refer now to FIG. 4A, schematically illustrating NOR gate 400 incorporating the principles of the present invention. NOR gate 400 includes two NMOS devices 401 and 402 and two PMOS devices 403 and 404. Gates of NMOS device 402 and PMOS device 404 are coupled together to form input 405, and gates of NMOS device 401 and PMOS device 403 are coupled together to form input 406. NOR gate 400 outputs at 407 the logical NOR of signal "A", at input 405, and signal "B", at input 406. A temperature-controlled NMOS back bias is supplied to back gates 408 and 409 of NMOS devices 401 and 402, respectively. NMOS devices 401 and 402 may be formed in a single p-well, such as p-type well 205 in FIG. 2, according to the principles of the present invention. A temperature-controlled PMOS back bias is supplied to back gates 410 and 411 of PMOS devices 403 and 404, respectively. PMOS devices 403 and 404 may be formed in a single n-type well, such as n-type well 211 in FIG. 2, according to the principles of the present invention.

Figure 4B:
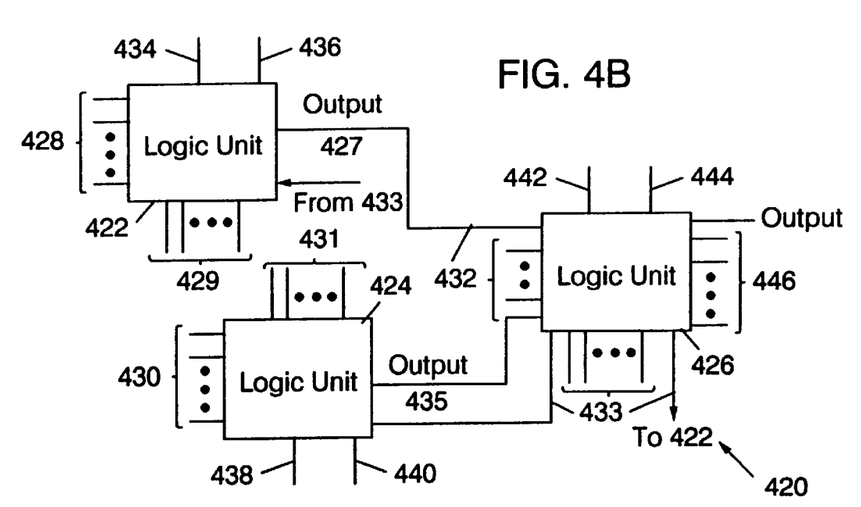
FIG. 4B illustrates, in block diagram form, a logic device in accordance with an embodiment of the present invention.

More generally, a self-timed logic device according to the principles of the present invention may include a plurality of logic units, each of which is subject to individual temperature control. One such embodiment in accordance with the principles of the present invention is illustrated in FIG. 4B, showing self-timed logic device 420, including three logic units 422, 424, and 426. Logic units 422, 424 and 426 perform Boolean evaluations on one or more logic inputs. Logic unit 422 includes an output 427 and a plurality of logic inputs 428, and logic unit 424 includes a plurality of logic inputs 430, and output 435. Logic unit 426 includes a plurality of inputs 432 wherein a first and second one of which may be coupled to output 427 of logic unit 422 and output 435 of logic unit 424. Logic device 420 is illustrative only, and other logic devices in accordance with the present invention may have a different predetermined number of logic units which are interconnected to each other and to external circuitry.

Logic units 422, 424 and 426 self-time by holding their respective outputs until signaled by each receiving unit. Logic unit 422 outputs a plurality of complete signals 429. The complete signals inform each source logic unit providing an input signal to one of the plurality of inputs 428 that logic unit 422 has received and acted upon the source unit's output. Output 427 of logic unit 422 is coupled to one of the plurality of inputs 432 of logic unit 426. Logic unit 426 outputs a plurality of completion signals 433, one of which is sent to logic unit 422. Logic unit 422 will hold output 427 until it receives the completion signal from logic unit 422. Logic unit 426 also receives output 435 of logic unit 424 on a second of its plurality of inputs 432. Logic unit 424 also receives one of the plurality of completion signals 433 from logic unit 426, and holds output 435 until the completion signal is received from logic unit 424. Logic unit 424 outputs a plurality of completion signals 431 to inform source logic units providing signals on inputs 430 that it has received and acted upon those input signals. Logic unit 426 includes a plurality of logic outputs 445 to external self-timed logic circuitry, and receives completion signals 446 from the external circuitry. Self-timed logic devices, such as logic device 420 have been described in U.S. Pat. No. 5,565,798, hereby incorporated herein by reference.

Logic unit 422 receives a first PMOS back bias 434 and a first NMOS back bias 436. Similarly, logic unit 424 receives a second PMOS back bias 438 and a second NMOS back bias 440. First PMOS back bias 434 and first NMOS back bias 436 may be controlled in response to a temperature of logic unit 422 whereby the speed of logic unit 422 is adjusted to keep its temperature within predetermined limits. Second PMOS back bias 438 and second NMOS back bias 440 may be controlled independently of the control of first PMOS back bias 434 and first NMOS back bias 436, being controlled in response to a temperature of logic unit 424. A speed of logic unit 424 is controlled in response to second PMOS back bias 438 and second NMOS back bias 440 to maintain the temperature of logic unit 424 within predetermined limits. Similarly, logic unit 426 may receive a third PMOS back bias 442 and a third NMOS back bias 444 that are independent of first and second PMOS back biases 434 and 438, and first and second NMOS back biases 436 and 440. Third PMOS back bias 442 and third NMOS back bias 444 control a speed of logic unit 426 in response to its temperature, whereby the temperature of logic unit 426 is maintained within predetermined limits. Because logic device 420 is self-timed, its speed may be determined by the one of logic units 422, 424 and 426 dissipating the most power in a particular application.

Figure 5:
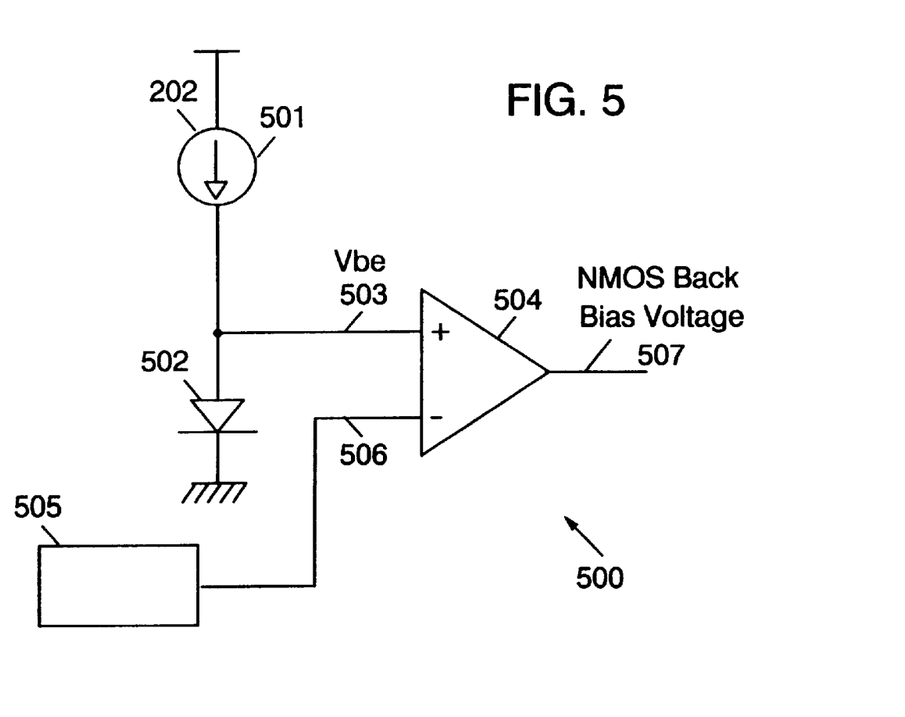
FIG. 5 illustrates, in partial schematic form, back bias generator circuitry in accordance with an embodiment of the present invention.

Refer now to FIG. 5 in which is schematically illustrated circuit 500 for generating an NMOS back bias in accordance with the principles of the present invention. Circuit 500 includes temperature independent constant current source 501 that provides a constant current through diode 502 thereby producing a voltage drop, $V_{be}$, across diode 502. $V_{be}$, is applied to input 503 of algebraic summing circuit 504. The temperature independent constant voltage source 505, outputting a constant reference voltage, $V_{ref}$, is coupled to a second input 506 of summing circuit 504. $V_{be}$ may be a positive voltage applied to a non-inverting input of a summing circuit 504 and $V_{ref}$ may also be a positive voltage supplied to an inverting input of summing circuit 504, wherein summing circuit 504 may be a differential amplifier. In such an embodiment, as shown in FIG. 5, input 503 may be the noninverting input and input 506 the inverting input. In an alternative embodiment, $V_{ref}$ may be a negative voltage, and $V_{be}$ may be a positive voltage wherein summing circuit 504 constitutes a summing amplifier, and inputs 506 and 506 may, in such an embodiment then both be noninverting inputs. NMOS back bias voltage 507 supplies an NMOS back gate such as back gate 301 in FIG. 3.

Diode 502 has a voltage drop, $V_{be}$, that is temperature dependent, whereby $V_{be}$ decreases as a temperature of diode 502 increases. That is, diode 502 has a negative temperature coefficient. According to the principles of the present invention, a temperature of a logic device may be controlled by having diode 502 in proximity to the logic circuit whereby its temperature is substantially the same as the temperature of the logic circuit. For a logic circuit designed to operate at a predetermined temperature, T, the magnitude of $V_{ref}$ may be chosen to be equal to the magnitude of $V_{be}$ when diode 502 is at the temperature T. In such an embodiment of the present invention, circuit 500 outputs NMOS back bias voltage 507 of 0 volts.

If the temperature of the logic circuit being controlled according to the principles of the present invention, such as logic device 422 in FIG. 4B, rises above T, then $V_{be}$ drops and the NMOS back bias voltage 507 becomes negative. Consequently, the threshold voltage of NMOS devices in the logic device being controlled also rises whereby the evaluation speed of the NMOS devices decreases. The decrease in speed reduces the power consumption of the NMOS devices and the temperature will drop accordingly. Conversely, if the temperature of the logic device decreases below T, $V_{be}$ will increase, and circuit 500 will output a positive NMOS back bias voltage 507. In response to the positive NMOS back bias voltage, the threshold voltage of NMOS devices in the logic device under control will fall whereby the evaluation speed of the NMOS devices will increase. The increased speed will also increase power consumption and the temperature of the logic device will increase toward T.

The operation of circuit 500 is summarized in Table 1, wherein the nominal operating temperature is shown to be 85° C. It would be understood, however, by an artisan of ordinary skill in the art that a logic device may have a predetermined nominal operating temperature other than 85° C. Such embodiments operate in precisely the same fashion, with respect to their nominal operating temperature as the embodiment, described in detail herein, of a logic device according to the principles of the present invention having a nominal operating temperature of 85° C. In Table 1, the threshold voltage of an NMOS device has been denoted $V_{thn}$ to indicate that the table applies to an NMOS device.

TABLE 1

| Temperature | $V_{be}$ | $V_{bs}$ | $V_{th}$ |
|---|---|---|---|
| Temp < 85° C. | $V_{be} < |V_{ref}|$ | $V_{bs} > 0$ | $V_{thn} \downarrow$ |
| Temp = 85° C. | $V_{be} = |V_{ref}|$ | $V_{bs} = 0$ | $V_{thn}$ = nominal |
| Temp > 85° C. | $V_{be} < |V_{ref}|$ | $V_{bs} < 0$ | $V_{thn} \uparrow$ |

Figure 6:
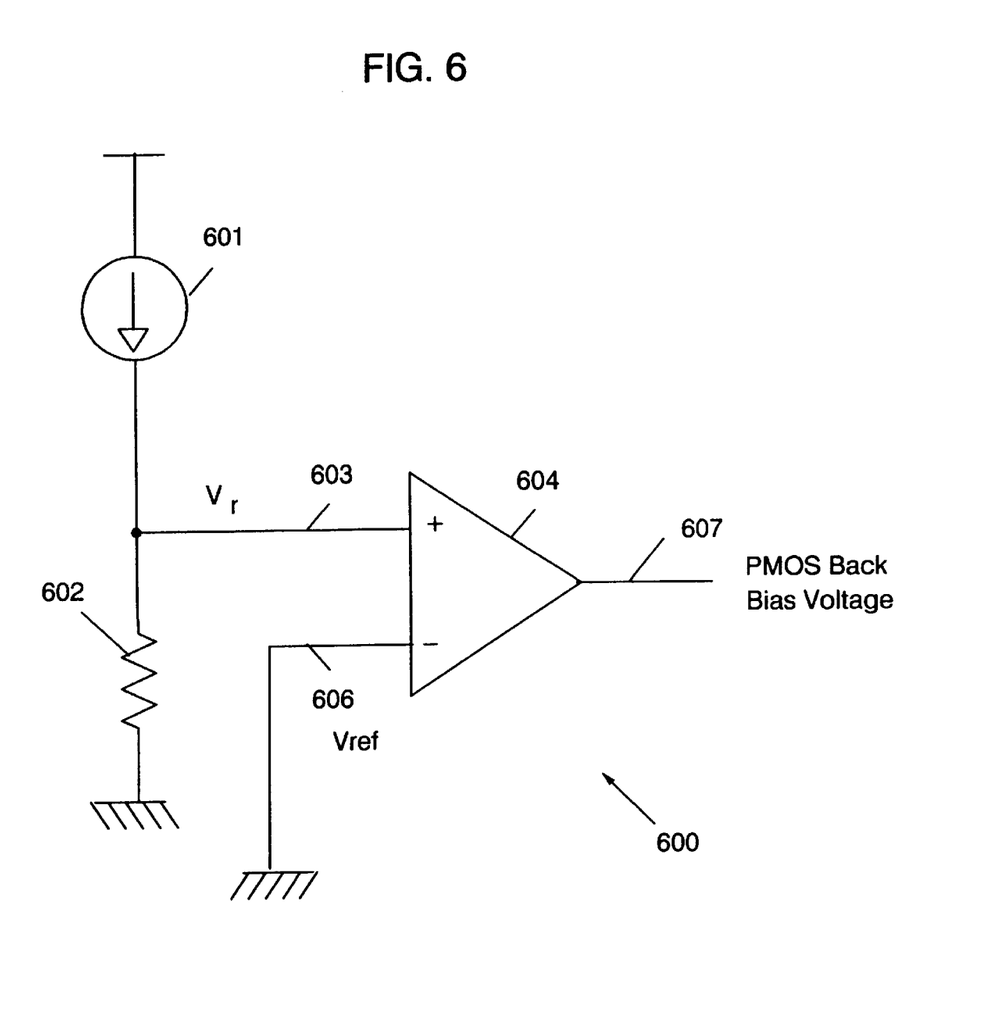
FIG. 6 illustrates, in partial schematic form, back bias generator circuitry in accordance with another embodiment of the present invention.

The speed of PMOS devices in a logic circuit may similarly be controlled. Referring to FIG. 6, a PMOS back bias voltage generator circuit 600 is illustrated. Circuit 600 includes a temperature independent constant current source 601 supplying a constant current to resistor 602. The current flowing through resistor 602 produces a voltage drop $V_r$. $V_r$ is supplied to an input 603 of summing circuit 604. A second input 606 of summing circuit 604 is coupled to second voltage supply, $V_{ss}$, which may be ground. In an embodiment of the present invention, $V_r$ may be a positive voltage, input 603 may be a non-inverting input, and input 606 may be an inverting input to summing circuit 604, wherein algebraic summing circuit 604 constitutes a differential amplifier. Circuit 600 outputs PMOS back bias voltage 607.

Resistor 602 may be in proximity to the logic device to be controlled. Its temperature may then be substantially the same as the temperature of the logic device under control, such as logic device 420 in FIG. 4. The temperature co-efficient of resistor 602 is positive wherein its resistance increases with increasing temperature. Thus, as the temperature of resistor 602 increases, $V_r$ also increases as a consequence of the constant current supplied to resistor 602 by constant current source 601. Constant current source 601 and resistor 602 are predetermined such that, at equilibrium, $V_r$ is substantially equal to supply voltage $V_{dd}$. In other words, PMOS back bias 607 of circuit 600 is substantially equal to $V_{dd}$ when the logic circuit under control is operating at its nominal temperature. Then, the voltage applied to n-well 211 in FIG. 2 is substantially the same as the voltage source 216 of PMOS device 202 or, equivalently, voltage supply 117 in FIG. 1. The voltage difference between n-well 211 and region 210, the bulk-to-source voltage $V_{bs}$, is 0 volts, and threshold voltage of PMOS device 202 has its nominal value. It would be understood by one of ordinary skill in the art that PMOS device 102 in FIG. 1 operates in the same way.

If the temperature of the logic device under control deviates from its nominal value, PMOS back bias 607 of circuit 600 adapts accordingly. If the temperature drops below the nominal value, $V_r$ decreases below $V_{dd}$ and PMOS back bias 607 concomitantly is less than $V_{dd}$. Consequently, $V_{bs}$ is negative wherein the threshold voltage of PMOS devices in the logic circuit under control, such as PMOS device 202 in FIG. 2, decreases below its nominal value, thereby speeding up the device. Conversely, if the temperature of the logic circuit under control increases above its nominal value, $V_r$ rises above $V_{dd}$ and PMOS back bias 607 rises accordingly. The resulting $V_{bs}$ is positive, causing the magnitude of the threshold voltage of the PMOS devices under control to rise above its nominal value. In turn, this causes the speed of the device to decrease. Recall that for PMOS devices, the threshold voltage is referenced to the most positive electrode in the device and is negative with respect thereto. (In the embodiment illustrated in FIG. 2, region 210, coupled to $V_{dd}$, is the most positive electrode.) Therefore, an increasing magnitude of threshold voltage corresponds to the threshold voltage itself becoming more negative and, conversely, a decreasing magnitude of threshold voltage corresponds to the threshold voltage itself becoming less negative.

The operation of generator circuit 600 is summarized in Table 2 wherein the nominal operating temperature is shown to be 85° C. It would be understood, however, by an artisan of ordinary skill in the art that a logic device may have a predetermined nominal operating temperature other than 85° C. Such embodiments operate in precisely the same fashion, with respect to their nominal operating temperature as the embodiment, described in detail herein, of a logic device according to the principles of the present invention having a nominal operating temperature of 85° C. The threshold voltage of a PMOS device has been denoted, in Table 2, as $V_{thp}$ to indicate that the table applies to PMOS devices. Also note that the threshold voltage of a PMOS device is negative, and that Table 2 shows the behavior of the magnitude of the threshold voltage.

TABLE 2

| Temperature | +V$_r$ | V$_{bs}$ | V$_{th}$ |
|---|---|---|---|
| Temp < 85° C. | V$_r$ < V$_{dd}$ | Vbs < 0 | \|V$_{thp}$\| ↓ |
| Temp = 85° C. | V$_r$ = V$_{dd}$ | Vbs = 0 | \|V$_{thp}$\| = nominal |
| Temp > 85° C. | V$_r$ > V$_{ref}$ | Vbs > 0 | \|V$_{thp}$\| ↑ |

Although the present invention and its advantages have been described in detail, it should be understood that various changes, substitutions and alterations can be made herein without departing from the spirit and scope of the invention as defined by the appended claims.

What is claimed is:

1. An apparatus for controlling power consumption of a logic device comprising:

a metal oxide semiconductor (MOS) device having a well comprising a first dopant region in a substrate, two second dopant regions in said well, a portion of said well being operable for forming a conducting channel there between, and a third region in said well having a predetermined first dopant concentration greater than a first dopant concentration in said well, wherein said third region is operable for receiving a back bias signal, and wherein said conducting channel forms in response to a threshold voltage controlled by said back bias signal; and a voltage generator circuit for generating said back bias signal coupled to said third region, wherein said voltage generator circuit is operable for outputting a voltage in response to said temperature of said logic device and wherein said output voltage controls said threshold voltage wherein said temperature of said logic device is returned to a predetermined temperature.

2. The apparatus of claim 1 wherein said voltage generator circuit further comprises:

a reference voltage signal;

an algebraic summing circuit having a first input coupled to said reference voltage signal; and a voltage source outputting a first voltage signal having a temperature dependent value, said voltage signal coupled to a second input of said summing circuit, wherein said summing circuit outputs a second voltage signal formed from a difference of a magnitude of said first voltage signal and a magnitude of said temperature dependent voltage signal.

3. The apparatus of claim 1 wherein said first dopant region comprises an acceptor dopant, and said second dopant regions comprises a donor dopant.

4. The apparatus of claim 1 wherein said first dopant region comprises a donor dopant, and said second dopant regions comprise an acceptor dopant.

5. The apparatus of claim 2 wherein said algebraic summing circuit comprises a differential amplifier.

6. The apparatus of claim 2 wherein said algebraic summing circuit comprises a summing amplifier, and wherein said reference voltage has a first polarity and said first voltage signal has a second polarity opposite said first polarity.

7. The apparatus of claim 2 wherein said voltage source comprises:

a constant current source; and a diode serially coupled to said constant current source, wherein said first voltage signal is output across terminals of said diode.

8. The apparatus of claim 2 wherein said voltage source comprises:

a constant current source; and a resistor serially coupled to said constant current source, wherein said first voltage signal is output across terminals of said resistor.

9. An apparatus for controlling power consumption of a logic device comprising:

a metal oxide semiconductor (MOS) device having a back gate electrode said back gate electrode being operable for modifying a threshold voltage of said MOS device in response to a voltage signal supplied thereto; and a voltage generator circuit for generating said voltage signal coupled to said back gate electrode, wherein said voltage generator circuit is operable for outputting said voltage signal in response to said temperature of said logic device and wherein said voltage signal controls said threshold voltage wherein said temperature of said logic device is returned to a predetermined temperature.

10. The apparatus of claim 9 wherein said voltage generator circuit further comprises:

a reference voltage signal;

an algebraic summing circuit having a first input coupled to said reference voltage signal; and a voltage source outputting a first voltage signal having a temperature dependent value, said voltage signal coupled to a second input of said summing circuit, wherein said summing circuit outputs a second voltage signal formed from a difference of a magnitude of said first voltage signal and a magnitude of said temperature dependent voltage signal.

11. The apparatus of claim 10 wherein said algebraic summing circuit comprises a differential amplifier.

12. The apparatus of claim 10 wherein said algebraic summing circuit comprises a summing amplifier, and wherein said reference voltage has a first polarity and said first voltage signal has a second polarity opposite said first polarity.

13. The apparatus of claim 10 wherein said voltage source comprises:

a constant current source; and a diode serially coupled to said constant current source, wherein said first voltage signal is output across terminals of said diode.

14. The apparatus of claim 10 wherein said voltage source comprises:

a constant current source; and a resistor serially coupled to said constant current source, wherein said first voltage signal is output across terminals of said resistor.

15. A method of controlling power consumption of a logic device comprising the steps of:

providing a back gate electrode in a metal oxide semiconductor device, wherein said back gate electrode is operable for modifying a threshold voltage of said MOS device in response to a voltage signal supplied thereto; and applying a voltage generator circuit to said back gate electrode, wherein said voltage generator circuit is operable for outputting said voltage signal in response to said temperature of said logic device wherein said voltage signal controls said threshold voltage wherein said temperature of said logic device is returned to a predetermined temperature.

16. The method of claim 15 wherein said step of applying a voltage generator circuit further comprises the step of adjusting said voltage generator circuit in response to said temperature of said logic device.

17. The method of claim 16 wherein said step of adjusting said voltage generator circuit further comprises the step of generating a temperature dependent voltage, wherein said temperature dependent voltage comprises a temperature dependent voltage drop across a circuit element, and wherein said temperature dependent voltage is generated in response to said temperature of said logic device.

18. The method of claim 15 wherein said voltage generator circuit comprises:
   a reference voltage signal;
   an algebraic summing circuit having a first input coupled to said reference voltage signal; and
   a voltage source outputting a first voltage signal having a temperature dependent value, said voltage signal coupled to a second input of said summing circuit, wherein said summing circuit outputs a second voltage signal formed from a difference of a magnitude of said first voltage signal and a magnitude of said temperature dependent voltage signal.

19. The method of claim 18 wherein said algebraic summing circuit comprises a differential amplifier.

20. The method of claim 18 wherein said algebraic summing circuit comprises a summing amplifier, and wherein said reference voltage has a first polarity and said first voltage signal has a second polarity opposite said first polarity.

21. The method of claim 18 wherein said voltage source comprises:
   a constant current source; and
   a diode serially coupled to said constant current source, wherein said first voltage signal is output across terminals of said diode.

22. The method of claim 18 wherein said voltage source comprises:
   a constant current source; and
   a resistor serially coupled to said constant current source, wherein said first voltage signal is output across terminals of said resistor.

23. An apparatus to control power consumption of a logic device comprising:
   a plurality of logic units, each logic unit performing a Boolean evaluation of a signal on at least one logic input, a logic output for outputting an output logic signal, at least one completion output for signaling to a logic unit having said output coupled to said at least one logic input, and at least one completion input for receiving a completion signal from a logic unit having said at least one input coupled to said output, at least one p-type semiconductor (PMOS) device and at least one n-type metal oxide semiconductor (NMOS) device, and wherein each logic unit includes an input for receiving a PMOS back bias signal, and an input for receiving an NMOS back bias signal; and
   a plurality of voltage generator circuits, wherein a first one of said plurality of voltage generator circuits outputs a temperature-controlled PMOS back bias signal coupled to a first one of said inputs for receiving said PMOS back bias signal, and a second one of said plurality of voltage generator circuits outputs a temperature-controlled NMOS back bias signal to a first one of said inputs for receiving said NMOS back bias signal.

24. The apparatus of claim 23 wherein said first and second voltage generators generate said temperature-controlled back bias signal in response to a temperature of a first one of said plurality of logic units.

25. The apparatus of claim 23 wherein said each said logic unit comprises a self-timed logic unit.

26. The apparatus of claim 24 wherein each voltage generator further comprises:
   a reference voltage signal;
   an algebraic summing circuit having a first input coupled to said reference voltage signal; and
   a voltage source outputting a first voltage signal having a temperature dependent value, said voltage signal coupled to a second input of said summing circuit, wherein said summing circuit outputs a second voltage signal formed from a difference of a magnitude of said reference voltage signal and a magnitude of said temperature dependent voltage signal.

27. The apparatus of claim 26 wherein said algebraic summing circuit comprises a differential amplifier.

28. The apparatus of claim 26 wherein said algebraic summing circuit comprises a summing amplifier, and wherein said reference voltage has a first polarity and said first voltage signal has a second polarity opposite said first polarity.

29. The apparatus of claim 26 wherein said voltage source comprises:
   a constant current source; and
   a diode serially coupled to said constant current source, wherein said first voltage signal is output across terminals of said diode.

30. The apparatus of claim 26 wherein said voltage source comprises:
   a constant current source; and
   a resistor serially coupled to said constant current source, wherein said first voltage signal is output across terminals of said resistor.

31. A method of controlling power consumption of a logic device comprising the steps of:
   sending a completion signal from a first logic unit in said logic device to a second logic unit in said logic device in response to said first logic unit evaluating a first logic signal output from said second logic unit to a logic input of said first logic unit;
   generating first and second temperature-controlled p-type metal oxide semiconductor (PMOS) back bias signals, wherein said first and second PMOS back bias signals are controlled in response to a temperature of said first and second logic units, respectively, and wherein said first PMOS back bias signal is applied to a PMOS back bias input of said first logic unit and said second PMOS back bias signal is supplied to a PMOS back bias input of said second logic unit; and
   generating first and second temperature-controlled n-type metal oxide semiconductor (NMOS) back bias signals, wherein said first and second NMOS back bias signals are controlled in response to a temperature of said first and second logic units, respectively, and wherein said first NMOS back bias signal is applied to a NMOS back bias input of said first logic unit and said second NMOS back bias signal is supplied to a NMOS back bias input of said second logic unit.

32. The method of claim 31 wherein said first and second PMOS back bias voltages are operable for controlling a threshold voltage of at least one PMOS device in said first and second logic units, respectively, and said first and second NMOS back bias voltages are operable for controlling a threshold voltage of at least one NMOS device in said first and second logic units, respectively.

33. The method of claim 31 wherein said first and second logic units comprise self-timed logic units.

34. The method of claim 31 wherein said step of generating first and second temperature-controlled PMOS back bias signals comprises the steps of:

providing a reference signal to a first input of an algebraic summing circuit;

providing a voltage source outputting a first voltage signal having a temperature dependent value, said voltage signal coupled to a second input of said summing circuit, wherein said summing circuit outputs a second voltage signal formed from a difference of a magnitude of said first voltage signal and a magnitude of said temperature dependent voltage signal; and outputting said second voltage signal.

35. The method of claim 31 wherein said step of generating first and second temperature-controlled NMOS back bias signals comprises the steps of:

providing a reference signal to a first input of an algebraic summing circuit;

providing a voltage source outputting a first voltage signal having a temperature dependent value, said voltage signal coupled to a second input of said summing circuit, wherein said summing circuit outputs a second voltage signal formed from a difference of a magnitude of said first voltage signal and a magnitude of said temperature dependent voltage signal; and outputting said second voltage signal.

36. The method of claim 35 wherein said voltage source comprises:

a constant current source; and a diode serially coupled to said constant current source, wherein said first voltage signal is output across terminals of said diode.

37. The method of claim 34 wherein said voltage source comprises:

a constant current source; and a resistor serially coupled to said constant current source, wherein said first voltage signal is output across terminals of said resistor.

38. A method of controlling power consumption of a logic device comprising the steps of sending a completion signal from a first logic unit in said logic device to a second logic unit in said logic device in response to said first logic unit evaluating a first logic signal output from said second logic unit to a logic input of said first logic unit, said second logic unit outputting a second logic signal in response to said completing signal;

generating first and second temperature-controlled p-type metal oxide semiconductor (PMOS) back bias signals, wherein said first and second PMOS back bias signals are controlled in response to a temperature of said first and second logic units, respectively, in wherein said first PMOS back bias signal is applied to a PMOS back bias input of said first logic unit and said second PMOS back bias signal supplied to a PMOS back bias input of said second logic unit; and generating first and second temperature-controlled n-type metal oxide semiconductor (NMOS) back bias signals, wherein said first and second NMOS back bias signals are controlled in response to said temperature of said first and second logic units, respectively, and wherein said first NMOS back bias signal is applied to a NMOS back bias input of said first logic unit and said second NMOS back bias signal supplied to a NMOS back bias input of said second logic unit, and wherein a rate of said first and second logic signals and said completion signal is determined in response to said first and second PMOS and said first and second NMOS back bias signals.

* * * * *